(12) United States Patent  
Uemura

(10) Patent No.: US 7,808,018 B2  
(45) Date of Patent: Oct. 5, 2010

(54) SOLID-STATE IMAGING APPARATUS

(75) Inventor: Akira Uemura, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 441 days.

(21) Appl. No.: 11/941,096

(22) Filed: Nov. 16, 2007

(65) Prior Publication Data

US 2008/0135885 A1     Jun. 12, 2008

(30) Foreign Application Priority Data

Dec. 12, 2006     (JP) ............................. 2006-334041

(51) Int. Cl.
*H01L 27/148* (2006.01)
*H01L 29/768* (2006.01)
(52) U.S. Cl. ..................... 257/239; 257/215; 257/222; 257/225
(58) Field of Classification Search ......... 257/213–239, 257/E27.153, E27.154, E27.16
See application file for complete search history.

(56) References Cited

U.S. PATENT DOCUMENTS 5,286,989 A * 2/1994 Yonemoto ................... 257/239

6,111,279 A * 8/2000 Nakashiba .................. 257/222

FOREIGN PATENT DOCUMENTS

| JP | 2-91954 | 3/1990 |
|---|---|---|
| JP | 7-46371 | 2/1995 |

\* cited by examiner

*Primary Examiner*—Cuong Q Nguyen
(74) *Attorney, Agent, or Firm*—Young & Thompson

(57) ABSTRACT

A solid-state imaging apparatus includes a pixel array comprising a plurality of light receiving elements disposed in a charge transfer direction, the plurality of light receiving elements converting a light signal into an electric signal, a first charge transfer unit and a second charge transfer unit arranged on each side of the pixel array and transferring a signal charge input from the pixel array in the charge transfer direction, a first floating diffusion region connected to the first charge transfer unit, a second floating diffusion region connected to the second charge transfer unit, a wiring layer connecting the first floating diffusion region with the second floating diffusion region, and an output circuit connected to the wiring layer and output a signal voltage in accordance with a potential of the first floating diffusion region and the second floating diffusion region.

10 Claims, 7 Drawing Sheets

SOLID-STATE IMAGING APPARATUS

BACKGROUND OF THE INVENTION

1. Field of the Invention

The present invention relates to a solid-state imaging apparatus, and, more specifically, to a linear image sensor having a pixel array in which a plurality of receiving elements are disposed along a charge transfer direction and of which a plurality of CCD registers are arranged on each side.

2. Description of Related Art

A linear image sensor transfers a signal charge which is stored in a light receiving element such as a photodiode via a CCD (Charge Coupled Device) register and outputs the signal charge which is converted to a voltage. The linear image sensor which has CCD registers arranged on each side of a photodiode (pixel) array is often used, because it is easy to be designed. The Staggered structure is also often used. The Staggered structure has a plurality of pixel arrays which is shifted by ½, ⅓, ¼ . . . pixel pitches. By having such a structure, the liner image sensor can be high-resolution.

As described above, the solid-state imaging apparatus which has CCD registers arranged on each side of the photodiode array is disclosed in Japanese Unexamined Patent Application Publication No. 2-91954 (Hirama). The solid-state imaging apparatus by Hirama discloses a structure in which each of the CCD registers is connected to the floating diffusion. However, when each of the CCD registers has an output circuit, the solid-state imaging apparatus needs to have two output circuits. Therefore, there is a problem that the area of the solid-state imaging apparatus increases.

To overcome the above problem, another solid-state imaging apparatus is disclosed by Hirama that two rows of the CCD registers are joined by folding back the edge on the same side of two rows of the CCD registers by 90 degrees. Then the joined CCD register is connected to a single floating diffusion. The floating diffusion converts the signal charge output from the joined CCD register into a voltage. In this case, as the CCD register is folded back by 90 degrees, it is difficult to layout design of the CCD register. Further, transfer efficiency of the signal charge input to the CCD register is easy to worsen. In another solid-state imaging apparatus, two rows of the CCD registers are approximated little by little. Then the junction of the joined CCD register is connected to a single floating diffusion.

FIG. 7 shows a solid-state imaging apparatus approximating the two rows of the CCD registers little by little, and connecting the joined CCD register to a single floating diffusion at the junction of the joined CCD register. As shown in FIG. 7, a solid-state imaging apparatus 90 has a photodiode array 91 including a light receiving element such as a plurality of photodiodes or the like, a CCD register 92, a CCD register 93, a floating diffusion 94, a reset transistor 95, an output circuit 96, and constant-voltage sources 91 to 93. The CCD register 92 and the CCD register 93 are joined at the end of the charge transfer direction. The output circuit 96 and the floating diffusion 94 are connected to a metal wiring 97. The floating diffusion 94 is connected to the reset transistor 95. In the solid-state imaging apparatus 90, the signal charge which is output from the CCD register 92 and the CCD register 93 is converted to the voltage at the floating diffusion 94, and the voltage is output from the output circuit 96 via the metal wiring 97.

Another solid-state imaging apparatus is disclosed in Japanese Unexamined Patent Application Publication No. 7-46371 (Akiyama). The solid-state imaging apparatus includes one or two output circuit(s). Then the output circuit outputs the voltage in accordance with the charge which is output from two rows of the CCD registers. That is, the solid-state imaging apparatus by Akiyama inputs the charge transferred by each CCD register into the charge composition portion, and a single output circuit connected to the charge composition portion outputs the voltage in accordance with signal charge. Otherwise the charge transferred by each CCD register is output from the output circuit connected to each CCD register.

However, in the solid-state imaging apparatus by Hirama which approximates two rows of the CCD registers little by little and outputs the signal charge from the single floating diffusion, the number of elements of the CCD register increases, and the area of the solid-state imaging apparatus increases. The reason is as follows. For example, when a photodiode disposed between the CCD register 92 and the CCD register 93 is large, the distance of the CCD register 92 and the CCD register 93 is long. In such a case, the CCD registers of two rows are approximated little by little, and the CCD registers of two rows are joined. The number of elements of the CCD register thereby increases. When the distance of two rows of the CCD registers is long, it needs a plurality of electrodes of the CCD register by approximating two rows of the CCD registers little by little for improvement in the ability of the transfer efficiency of the signal charge. That is, the area of the solid-state imaging apparatus increases. In the solid-state imaging apparatus disclosed in Akiyama, when two rows of the CCD registers are joined, a plurality of the elements of the CCD register are needed to be disposed and the area of the solid-state imaging apparatus increases like the technique by Hirama. When two rows of each CCD register outputs the signal charge, the area of the solid-state imaging apparatus increases because each CCD register has an output circuit.

SUMMARY

In one embodiment of the present invention, a solid-state imaging apparatus includes a pixel array comprising a plurality of light receiving elements disposed in a charge transfer direction, the plurality of light receiving elements converting a light signal into an electric signal, a first charge transfer unit and a second charge transfer unit arranged on each side of the pixel array and transferring a signal charge input from the pixel array in the charge transfer direction, a first floating diffusion region connected to the first charge transfer unit, a second floating diffusion region connected to the second charge transfer unit, a wiring layer connecting the first floating diffusion region with the second floating diffusion region, and an output circuit connected to the wiring layer and output a signal voltage in accordance with a potential of the first floating diffusion region and the second floating diffusion region.

According to the embodiment of the present invention, the floating diffusion region is connected to a plurality of CCD registers by the wiring layer, to thereby forming a single output circuit.

The solid-state imaging apparatus of the present invention enables prevention of the increase of the area of the solid-state imaging apparatus and deterioration of the transfer efficiency.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
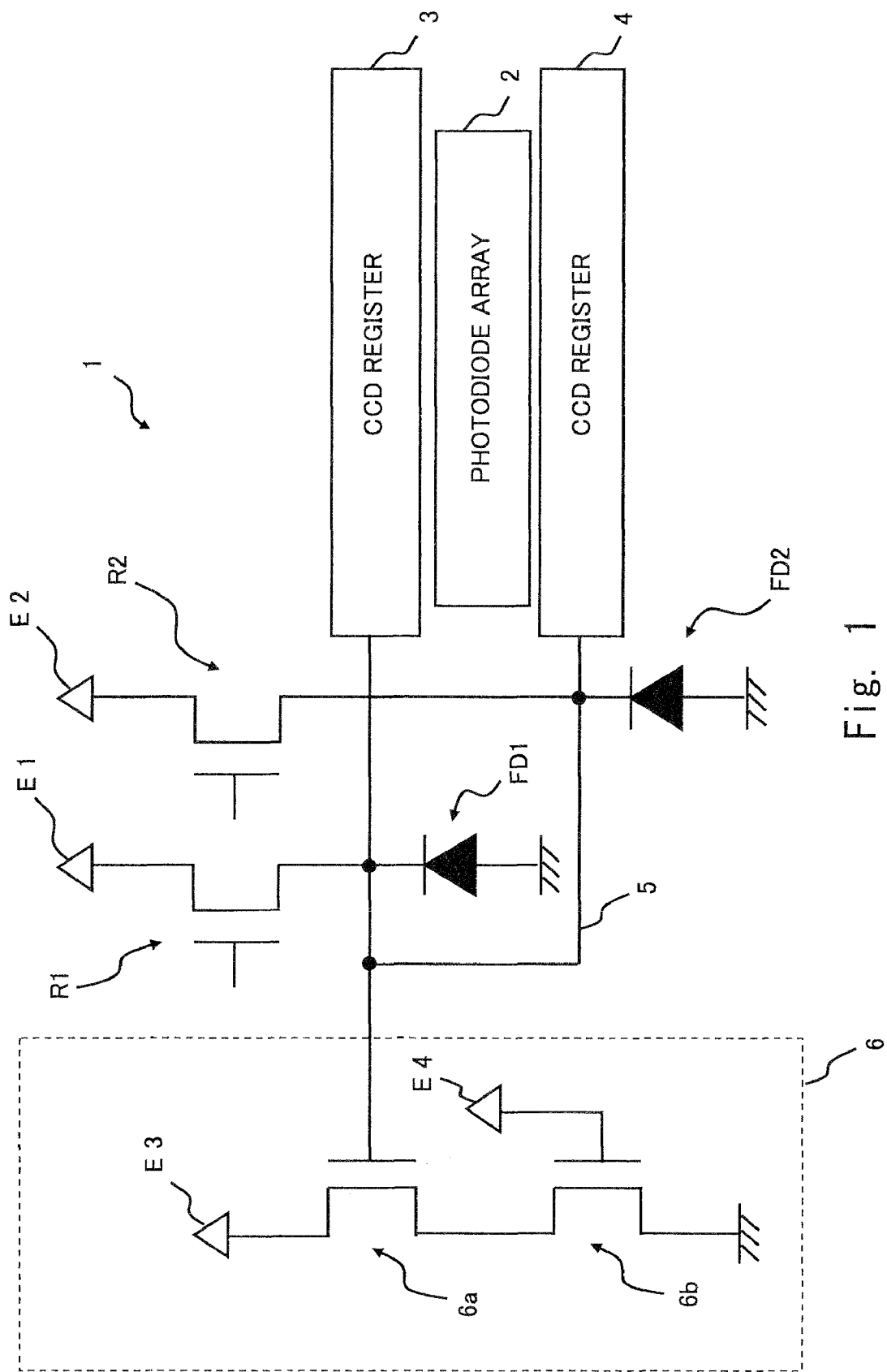
FIG. 1 is a schematic diagram of a solid-state imaging apparatus according to a first embodiment of the invention.

A first embodiment of the present invention is described hereinafter with reference to FIG. 1. FIG. 1 is a schematic diagram of a solid-state imaging apparatus 1 according to this embodiment. As shown in FIG. 1, the solid-state imaging apparatus 1 includes a photodiode array 2 (a pixel array), a CCD register 3 (a first charge transfer unit), a CCD register 4 (a second charge transfer unit), floating diffusions FD1 and FD2 (first and second floating diffusion regions), a metal wiring 5 (a wiring layer), an output circuit 6, reset transistors R1 and R2, and a plurality of constant-voltage sources E1 to E4. The structure of the solid-state imaging apparatus 1 is described hereinafter in detail.

The CCD register 3 and the CCD register 4 are each arranged on each side of the photodiode array (the pixel array) 2. In the photodiode array 2, a light receiving element such as a plurality of the photodiodes (pixels) is disposed in a charge transfer direction (not shown). The CCD register 3 and the CCD register 4 are charge transfer units to transfer the signal charge. The CCD register 3 and the CCD register 4 transfer the charge in the same direction. The CCD register 3 includes an output gate (not shown) which is formed at the end of the charge transfer direction. The CCD register 4 includes an output gate (not shown) which is formed at the end of the charge transfer direction. The output gate which is formed at the end of the CCD register 3 is connected to the floating diffusion FD1. The output gate which is formed at the end of the CCD register 4 is similarly connected to the floating diffusion FD2. The floating diffusion FD1 formed in a semiconductor substrate and the floating diffusion FD2 formed in the semiconductor substrate are separated from each other. These floating diffusions FD1 and FD2 are connected to each other by the metal wiring 5, and this metal wiring 5 is connected to the output circuit 6. In this embodiment, as the floating diffusions FD1 and FD2 are connected by the metal wiring 5, the floating diffusion operates as a single capacitor. And the voltage in accordance with the signal charge can be output from the single output circuit 6. To prevent the mixture of the signal charge which is stored in a pixel to pixel basis, the floating diffusion FD1 is connected to the reset transistor R1 and the floating diffusion FD2 is connected to the reset transistor R2. The floating diffusion FD1 is a drain region of the reset transistor R1. Details are described later. A first reset drain RD1 which is a source region of the reset transistor R1 is connected to the constant-voltage source E1, and a second reset drain RD2 which is a source region of the reset transistor R2 is connected to the constant-voltage source E2. The output circuit 6 includes a transistor 6a and a transistor 6b, for example. The structure of the output circuit 6 corresponds to a source follower. The transistor 6a is connected to the constant-voltage source E3, and the transistor 6b is connected to the constant-voltage source E4.

Figure 2:
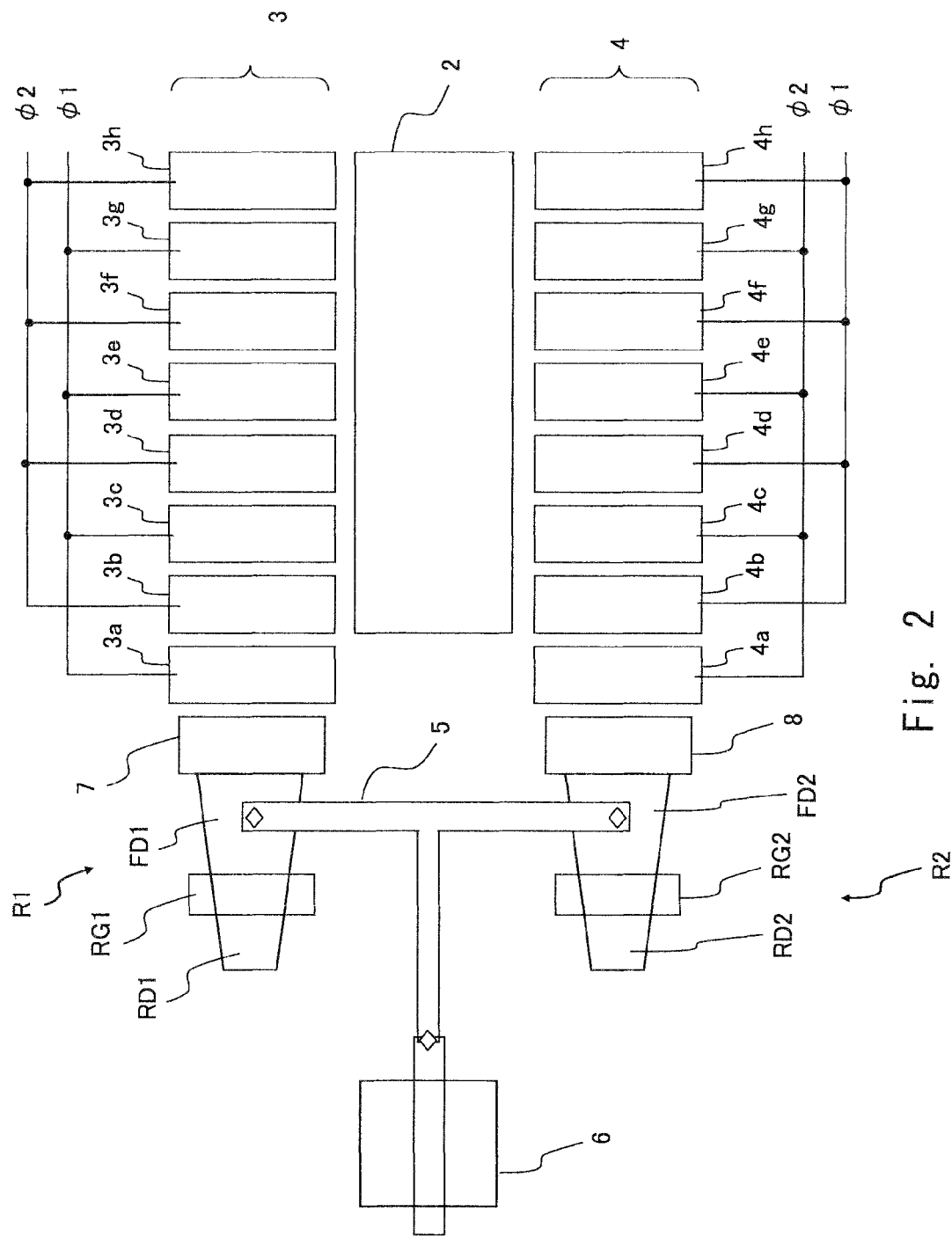
FIG. 2 is an example of a layout diagram of the solid-state imaging apparatus shown in FIG. 1.

The structure of the solid-state imaging apparatus 1 is described in detail with reference to FIG. 2 which is an example of the layout diagram of the solid-state imaging apparatus 1 shown in FIG. 1. The CCD register 3 and the CCD register 4 shown in FIG. 2 include a plurality of transfer electrodes formed on the insulating film which is formed on the semiconductor substrate, for example. Two-phase clock pulses $\phi 1$ and $\phi 2$ for transferring are applied to the transfer electrodes. The CCD register 3 includes transfer electrodes 3a to 3h, and the clock pulses $\phi 1$ or $\phi 2$ for transferring are alternately input to the transfer electrodes 3a to 3h. Similarly the CCD register 4 includes transfer electrodes 4a to 4h, and the clock pulses $\phi 1$ or $\phi 2$ for transferring are alternately input to the transfer electrodes 4a to 4h. The charge stored in the photodiode of the odd number array of the photodiode array 2 is input to the CCD register 3 for example, and the charge is output from the output gate 7 (a first output gate) formed at the end of the CCD register 3. The charge stored in the photodiode of the even number array of the photodiode array 2 is input to the CCD register 4 for example, and the charge is output from the output gate 8 (a second output gate) formed at the end of the CCD register 4. The DC-voltage is constantly applied to the output gate 7 and the output gate 8, and the output gate 7 and the output gate 8 of each CCD register output the charge which is transferred to the output gates 7 and 8. A reset transistor R1 has a first reset gate RG1 as a gate electrode. The first reset gate RG1 is provided between the floating diffusion FD1 and the first reset drain RD1. The reset transistor R2 has a second reset gate RG2 as a gate electrode. The second reset gate RG2 is provided between the floating diffusion FD2 and the second reset drain RD2.

Next, operation of the solid-state imaging apparatus 1 described above is described. The photoelectric conversion is performed by each photodiode of the photodiode array 2 on the signal charge. Then the signal charge is stored in each photodiode for a given period of time. Then the signal charge stored in each photodiode is transferred to the CCD register 3 or the CCD register 4 via a transfer gate not shown in the figure. The signal charge which is stored in the photodiode of the odd number array of the photodiode array 2 is transferred to the CCD register 3, for example. The signal charge which is stored in the photodiode of the even number array of the photodiode array 2 is transferred to the CCD register 4, for example.

The signal charge transferred to the CCD register 3 or the CCD register 4 is sequentially transferred to the output gate formed at the end of each CCD register. The CCD register 3 and the CCD register 4 operate by applying the clock pulses $\phi 1$ and $\phi 2$, and the input signal charge is transferred to the output gate formed at the end of the CCD register in series. The CCD register 3 outputs the charge from the output gate 7 to the floating diffusion FD1. The CCD register 4 outputs the charge from the output gate 8 to the floating diffusion FD2. At this time, in accordance with the clock pulse $\phi 1$ arid clock pulse φ2, the charge is alternately output from the CCD register 3 or the CCD register 4 to each floating diffusion which is connected to the CCD register 3 or the CCD register 4. The transfer electrode 3a is formed in front of the output gate 7 at the end of the charge transfer direction of the CCD register 3. And the clock pulse φ1 for transferring is input to the transfer electrode 3a. Therefore, when the clock pulse φ1 for transferring goes down, the transfer electrode 3a outputs the transferred signal charge to the floating diffusion FD1 via the output gate 7. The transfer electrode 4a is formed in front of the output gate 8 at the end of the charge transfer direction of the CCD register 4. The clock pulse 2 for transferring is input to the transfer electrode 4a. Therefore, when the clock pulse φ2 for transferring goes down, the transfer electrode 4a outputs the transferred signal charge to the floating diffusion FD2 via the output gate 8. The CCD register 3 and the CCD register 4 output the signal charge alternately.

The clock pulse φ1 for transferring is input to the transfer electrode 3a of the CCD register 3. The charge which is output to the floating diffusion FD1 via the output gate 7 is converted to the voltage by a junction capacitor (not shown) of the floating diffusion FD1. In this embodiment, as the floating diffusion FD1 and the floating diffusion FD2 are connected to each other by the metal wiring 5, the floating diffusion FD1 and the floating diffusion FD2 operate as a single capacitor. The charge of the certain one pixel output from the CCD register 3 is stored in the combination capacitor composed of the floating diffusion FD1 and the floating diffusion FD2. The charge is converted to the voltage in accordance with each charge. The voltage which is converted at the floating diffusion FD1 and the floating diffusion FD2 is combined, and the voltage is output to the output circuit 6 via the metal wiring 5. When the voltage in accordance with the charge is output to the output circuit 6, the potential of the floating diffusion FD1 is initialized by the reset transistor R1 which is controlled by the reset pulse φR. Similarly, the potential of the floating diffusion FD2 is initialized by the reset transistor R2 which is controlled by the reset pulse φR.

The charge which is output from the CCD register 3 is stored in the floating diffusion FD1 and the floating diffusion FD2. To prevent the mixture of the signal charge of each pixel, the potential of the floating diffusion FD1 and the floating diffusion FD2 is initialized before outputting the charge from the CCD register 4 to the floating diffusion FD2. Therefore, it is possible to prevent the mixture of the signal charge of each pixel which is input to the floating diffusion FD1 and the floating diffusion FD2. After the potential of the floating diffusion FD1 and the floating diffusion FD2 is initialized, the signal charge of the next pixel is input from the CCD register 4 to the floating diffusion FD2. The voltage is output to the output circuit 6 in accordance with the input charge, and the output circuit 6 outputs a signal voltage in accordance with the input voltage.

Figure 3:
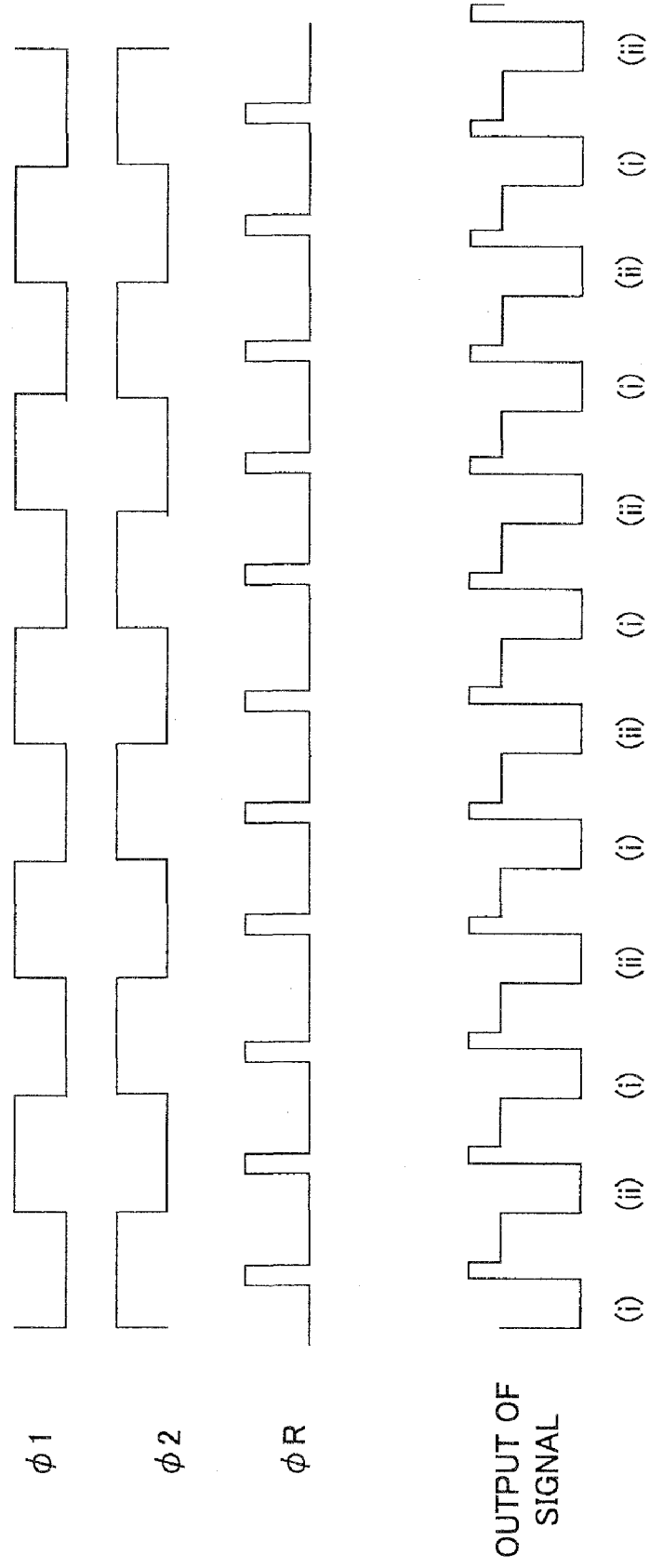
FIG. 3 is a driving timing diagram of the solid-state imaging apparatus according to the first embodiment of the invention.

FIG. 3 shows a driving timing diagram of the solid-state imaging apparatus 1 described above. A time period (i) shows the output signal of the CCD register 3, and a time period (ii) shows the output signal of the CCD register 4. As shown in FIG. 3, after the voltage in accordance with the charge output from the CCD register 3 is output, the reset pulse OR is applied. Then the voltage in accordance with the charge output from the CCD register 4 is output. That is, the output circuit 6 of the solid-state imaging apparatus 1 alternately outputs the signal from the CCD register 3 and the CCD register 4.

In this embodiment, each of the CCD register 3 and the CCD register 4 is connected to the floating diffusion. The CCD register 3 is connected to the floating diffusion FD1 and the CCD register 4 is connected to the floating diffusion FD2. The floating diffusions FD1 and FD2 are connected with each other by the metal wiring 5 and made to operate as a single capacitor. The floating diffusions FD1 and FD2 are connected to a single output circuit 6. Each of the floating diffusions FD1 and FD2 is connected to the reset transistor. According to the related art, each of the floating diffusions FD1 and FD2 is connected to the output circuit respectively. On the other hand, in the present embodiment of this invention, as the floating diffusions FD1 and FD2 are connected to each other by the metal wiring 5, only one output circuit 6 is used. Therefore, increasing of the area of the layout of the solid-state imaging apparatus 1 maybe prevented. Each CCD register is connected to the floating diffusion without joining the CCD register 3 and the CCD register 4. It is not needed to join the CCD registers. Therefore, increasing of the area of the solid-state imaging apparatus 1 may be prevented. In addition, as a plurality of CCD registers are not joined and the CCD register is not folded back, the joining which is difficult for layout design is not needed. Therefore, designing of the solid-state imaging apparatus 1 is easy. As the CCD registers 3 and 4 are linearly arranged without folding back, the deterioration of the transfer efficiency of the signal charge may be prevented.

According to the present embodiment, the charge which is stored in the photodiode of the odd number array in the photodiode array 2 is input to the CCD register 3, and the charge which is stored in the photodiode of the even number array in the photodiode array 2 is input to the CCD register 4. However, the charge which is stored in the photodiode of the even number array in the photodiode array 2 may be input to the CCD register 3, and the charge which is stored in the photodiode of the odd number array in the photodiode array 2 may be input to the CCD register 4. The structure of the solid-state imaging apparatus may be a staggered structure, which includes two photodiode arrays comprising pixels being shifted by half pixel pitch and the CCD register which is arranged for each pixel array. The metal wiring 5 is not limited to the metal but can be any conductive material.

Second Embodiment

Figure 4:
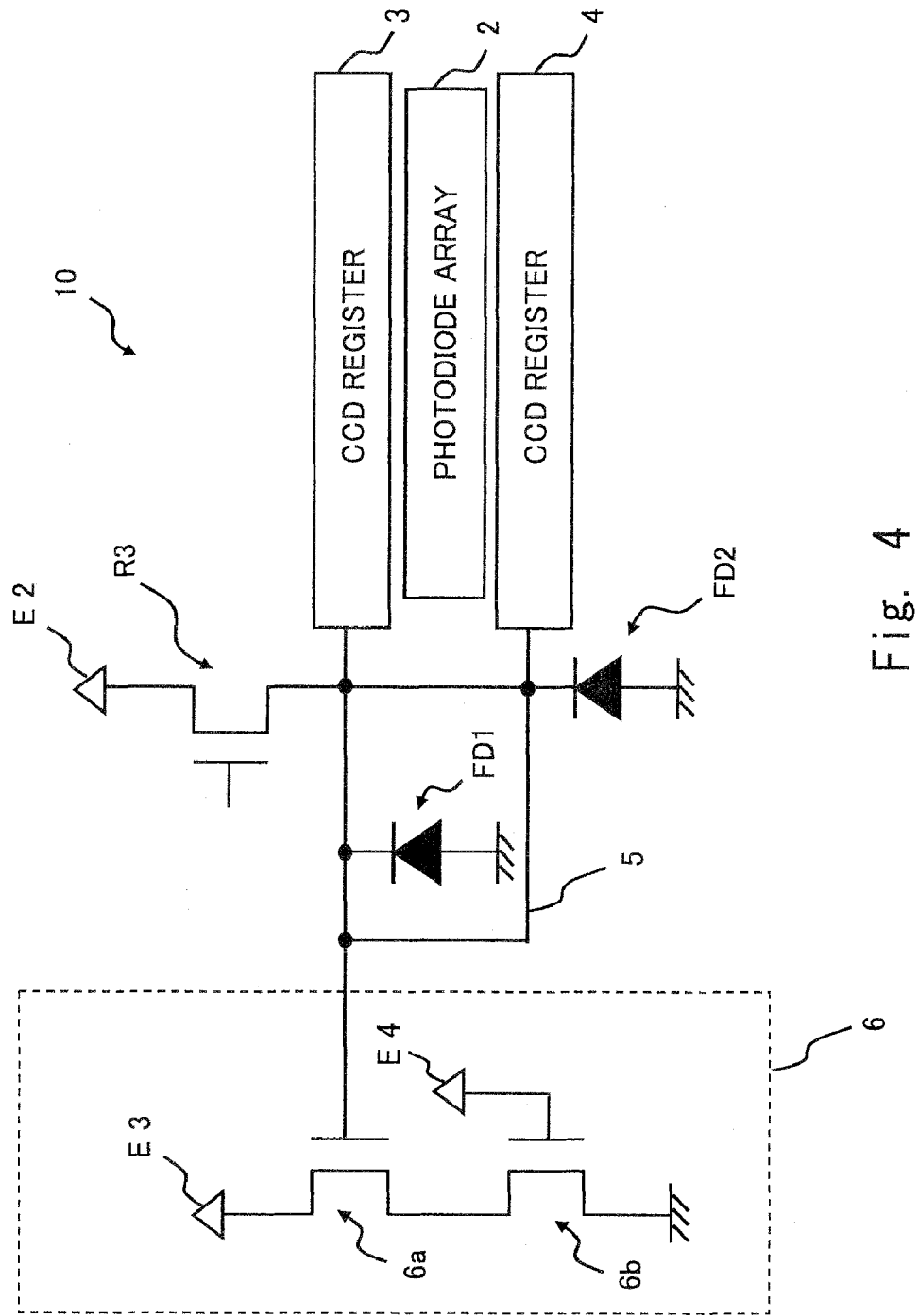
FIG. 4 is a schematic diagram of the solid-state imaging apparatus according to a second embodiment of the invention.

Next, second embodiment of the present invention is described hereinafter. In the first embodiment, the floating diffusion FD1 is connected to the reset transistor R1, and the floating diffusion FD2 is connected to the reset transistor R2. In the second embodiment, to achieve further miniaturization and to raise the sensitivity of the solid-state imaging apparatus, only one reset transistor is formed instead of forming the reset transistor which is connected to each of the floating diffusion FD1 and the floating diffusion FD2. The solid-state imaging apparatus 10 in this embodiment is shown in FIG. 4. In the second embodiment, the same elements as in the first embodiment are denoted by the same reference symbols, and the details thereof are omitted.

As shown in FIG. 4, the floating diffusion FD1 and the floating diffusion FD2 are commonly connected to the reset transistor R3. The floating diffusion FD1 and the floating diffusion FD2 are connected to each other by the metal wiring 5. The potential of the floating diffusions FD1 and FD2 is initialized by the reset transistor R3 which is controlled by the reset pulse φR. The voltage which is converted by each of the floating diffusions FD1 and FD2 is output to the output circuit 6 via the metal wiring 5, and the output circuit 6 outputs the signal voltage in accordance with the input voltage. In this embodiment, as the solid-state imaging apparatus has the reset transistor R3 which is commonly connected to the floating diffusions FD1 and FD2, a parasitic capacitance of the solid-state imaging apparatus 10 can be decreased and the sensitivity of the output voltage can be improved. The solid-state imaging apparatus 10 includes only one reset transistor, to thereby decreasing the area of the solid-state imaging apparatus 10.

Figure 5:
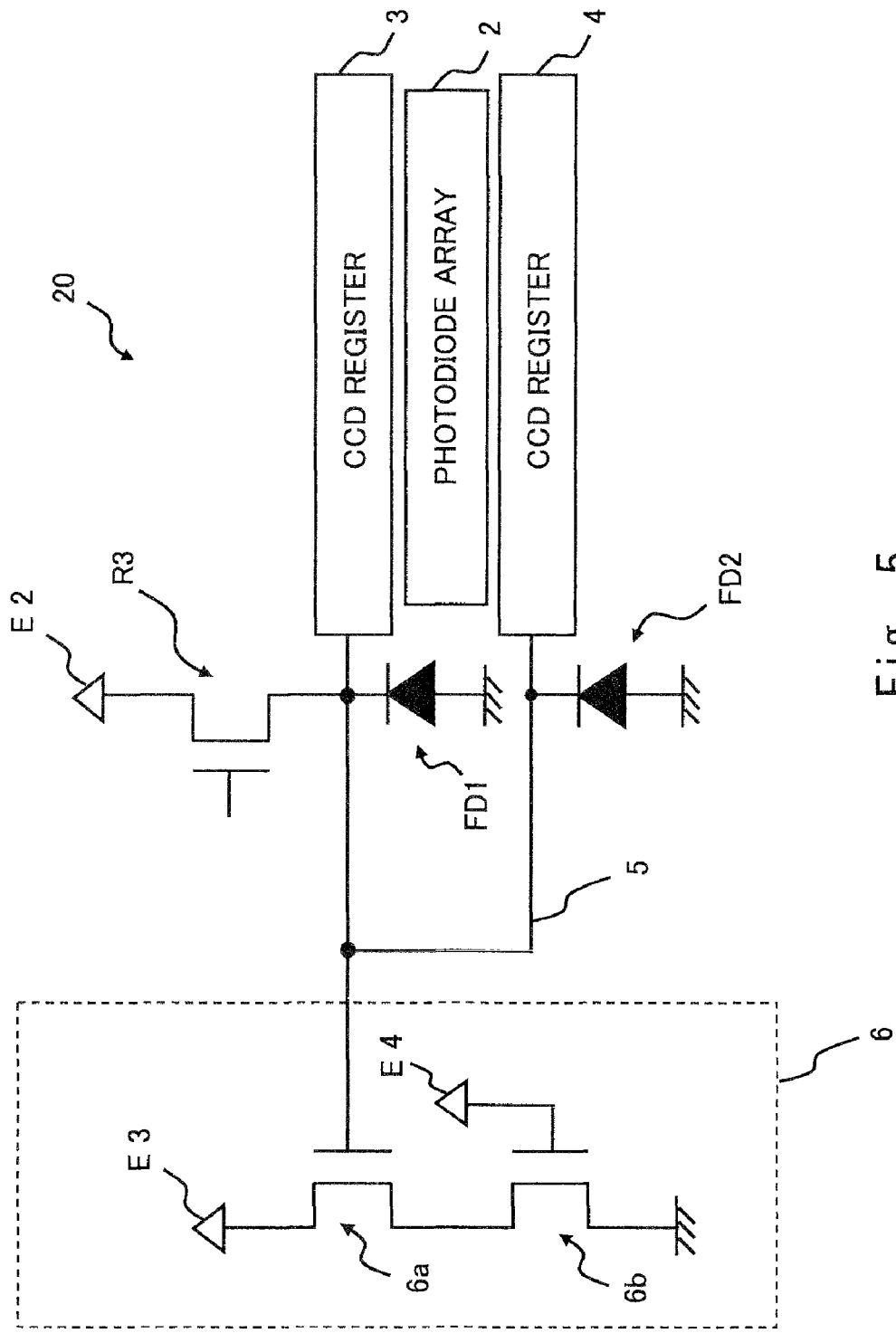
FIG. 5 is a schematic diagram of the solid-state imaging apparatus.

FIG. 5 is a schematic diagram of the solid-state imaging apparatus 20. The solid-state imaging apparatus 20 shows another example of the structure of the solid-state imaging apparatus 10. In the solid-state imaging apparatus 20, the same elements shown in the solid-state imaging apparatus 10 are denoted by the same reference symbols, and the description thereof are omitted.

Figure 6:
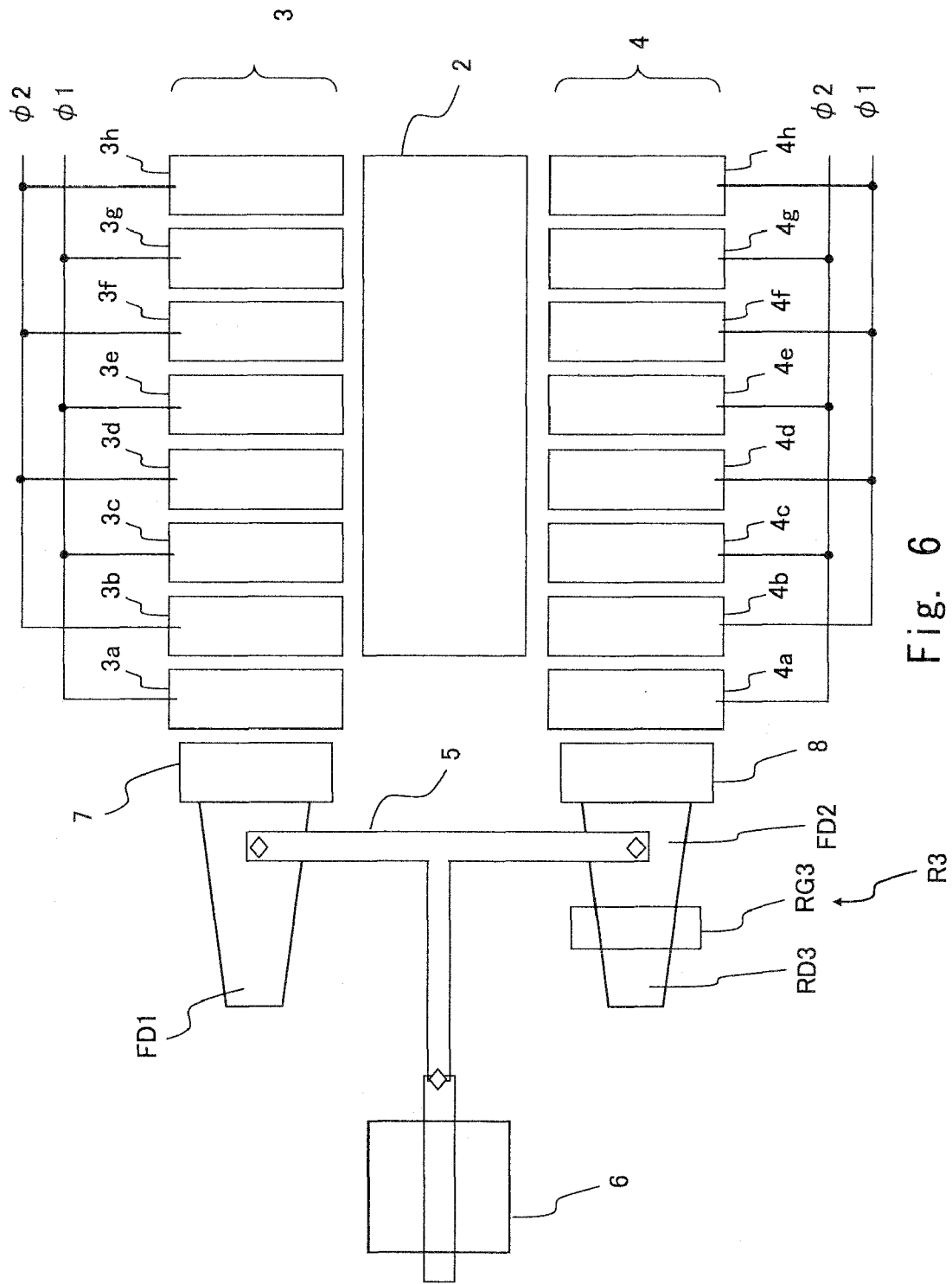
FIG. 6 is a layout diagram of the solid-state imaging apparatus shown in FIG. 5.
Figure 7:
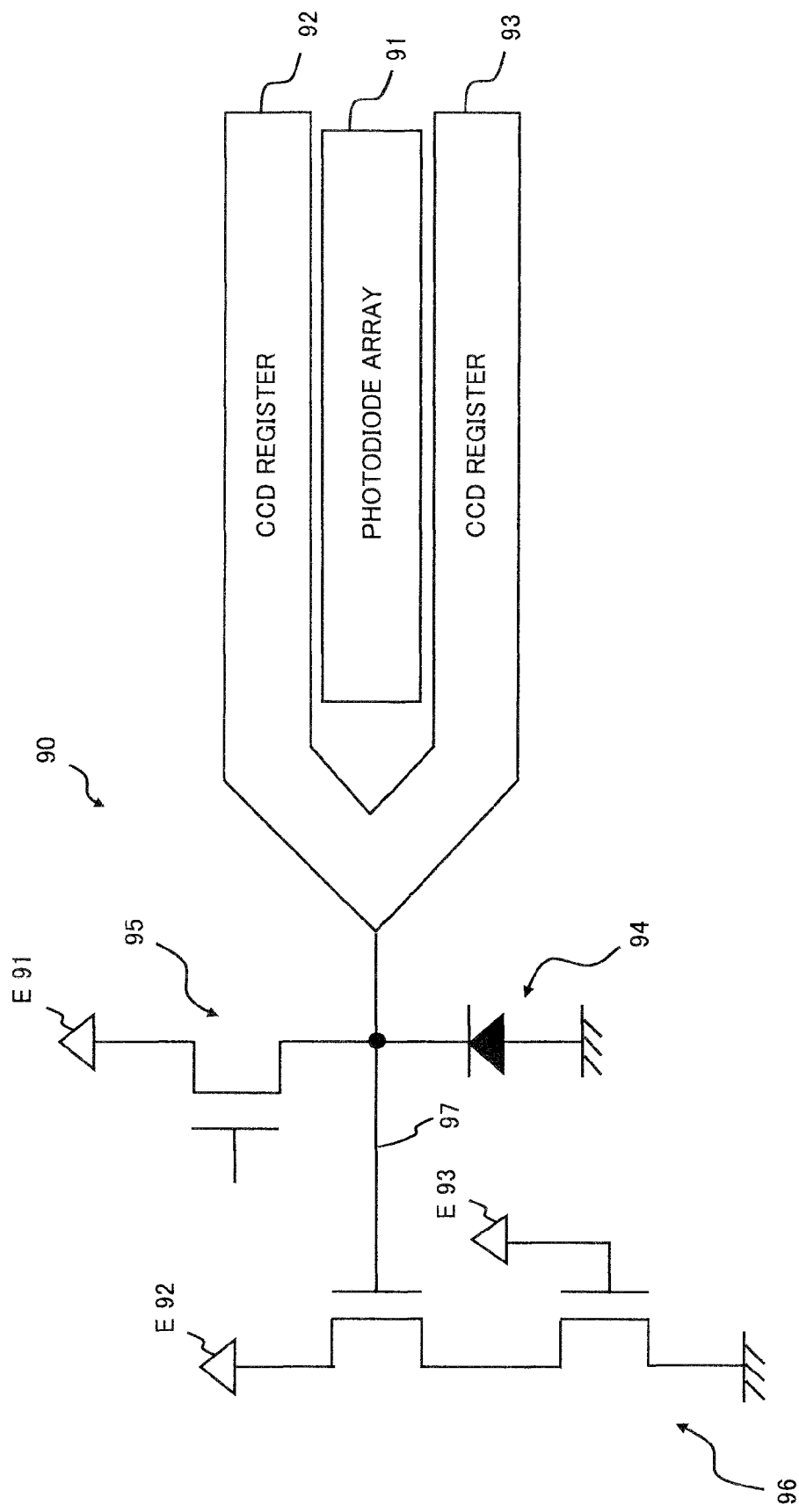
FIG. 7 is a schematic diagram of the solid-state imaging apparatus according to a related art.

The wiring which connects the reset transistor R3 to the floating diffusion FD2 is shown in FIG. 4. The wiring which connects the reset transistor R3 to the floating diffusion FD2 is parallel to the wiring 5. However, in FIG. 5, the wiring which connects the reset transistor R3 to the floating diffusion FD2 is not shown. In the circuit shown in FIG. 5, the reset transistor R3 and the floating diffusion FD2 are connected via the wiring 5. Thereby, the wiring can be simplified in the solid-state imaging apparatus 20. The structure of the solid-state imaging apparatus 20 is described in detail with reference to FIG. 6 which shows a layout of the solid-state imaging apparatus 20 shown in FIG. 5. The structure of the solid-state imaging apparatus 20 is briefly described below. As shown in FIG. 6, a reset transistor R3 is formed in the solid-state imaging apparatus 20. The reset transistor R3 has a third reset gate RG3 as a gate electrode. The third reset gate RG3 is provided between the floating diffusion FD2 and the third reset drain RD3. The reference numeral RD3 of FIG. 5 corresponds to the reference numeral RD2 of FIG. 2. Similarly, the reference numeral RG3 of FIG. 5 corresponds to the reference numeral RG2 of FIG. 2.

In FIG. 6 a solid-state imaging apparatus 20 has a reset transistor R3 which is formed at the floating diffusion FD2 side. However, the reset transistor R3 may be formed at the floating diffusion FD1 side instead of the floating diffusion FD2 side. According to the example shown in FIG. 5, the wiring can be simplified than the example shown in FIG. 4.

It is apparent that the present invention is not limited to the above embodiment, but it may be modified and changed without departing from the scope and spirit of the invention. The present invention can be applied to the CCD register which is arranged in n rows (n≧3) instead of two rows.

What is claimed is:

1. A solid-state imaging apparatus comprising:
   a pixel array comprising a plurality of light receiving elements disposed in a charge transfer direction, the plurality of light receiving elements converting a light signal into an electric signal;
   a first charge transfer unit and a second charge transfer unit respectively arranged on a first side and a second side of the pixel array and transferring a signal charge input from the pixel array in the charge transfer direction;
   a first floating diffusion region connected to the first charge transfer unit;
   a second floating diffusion region connected to the second charge transfer unit;
   a wiring layer connecting the first floating diffusion region with the second floating diffusion region; and
   an output circuit connected to the wiring layer and output a signal voltage in accordance with a potential of the first floating diffusion region and the second floating diffusion region.

2. The solid-state imaging apparatus according to claim 1, further comprising:
   a reset drain; and
   a reset gate provided between the first floating diffusion region and the reset drain.

3. The solid-state imaging apparatus according to claim 2, wherein the reset drain and the reset gate are a first reset drain and a first reset gate, respectively, and the solid-state imaging apparatus further comprises a second reset drain and a second reset gate provided between the second floating diffusion region and the second reset drain.

4. A solid-state imaging apparatus comprising:
   a plurality of pixels arranged in a charge transfer direction;
   first and second charge transfer units arranged on first and second sides of the plurality of pixels, respectively, and transferring a signal charge input from the plurality of pixels in the charge transfer direction;
   first and second floating diffusion regions connected to the first and second charge transfer units, respectively;
   a wiring layer connecting the first and second floating diffusion regions; and
   a single output circuit connected to the wiring layer and output a signal voltage in accordance with a potential of the first floating diffusion region and the second floating diffusion region.

5. The solid-state imaging apparatus according to claim 4, further comprising:
   a reset drain; and
   a reset gate provided between the first floating diffusion region and the reset drain.

6. The solid-state imaging apparatus according to claim 5, wherein the reset drain and the reset gate are a first reset drain and a first reset gate, respectively, and the solid-state imaging apparatus further comprises a second reset drain and a second reset gate provided between the second floating diffusion region and the second reset drain.

7. A solid-state imaging apparatus comprising:
   a first floating diffusion region;
   a first charge transfer unit;
   a first output gate provided between the first floating diffusion region and the first charge transfer unit;
   a second floating diffusion region;
   a second charge transfer unit;
   a second output gate provided between the second floating diffusion region and the second charge transfer unit; and
   a wiring layer connecting the first floating diffusion region and the second floating diffusion region to each other.

8. The solid-state imaging apparatus according to claim 7, further comprises an output circuit connected to the wiring layer.

9. The solid-state imaging apparatus according to claim 8, further comprising:
   a reset drain; and
   a reset gate provided between the first floating diffusion region and the reset drain.

10. The solid-state imaging apparatus according to claim 9, wherein the reset drain and the reset gate are a first reset drain and a first reset gate, respectively, and the solid-state imaging apparatus further comprises a second reset drain and a second reset gate provided between the second floating diffusion region and the second reset drain.

* * * * *